US012716951B2

(12) United States Patent
Allag et al.

(10) Patent No.: US 12,716,951 B2
(45) **Date of Patent: *Aug. 25, 2026**

(54) DEVICE TO DEVICE MEASUREMENT SYNCHRONIZATION

(71) Applicant: Texas Instruments Incorporated, Dallas, TX (US)

(72) Inventors: Tahar Allag, Irving, TX (US); Kyl Wayne Scott, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 185 days.

This patent is subject to a terminal disclaimer.

(21) Appl. No.: 18/363,121

(22) Filed: Aug. 1, 2023

(65) Prior Publication Data

US 2023/0408593 A1 Dec. 21, 2023

Related U.S. Application Data

(62) Division of application No. 17/489,593, filed on Sep. 29, 2021, now Pat. No. 11,754,634.

(51) Int. Cl.
*G01R 31/3842* (2019.01)
*B60L 58/22* (2019.01)
(Continued)

(52) U.S. Cl.
CPC .......... *G01R 31/3842* (2019.01); *B60L 58/22* (2019.02); *H02J 7/52* (2026.01); *H02J 7/80* (2026.01); *B60L 2210/10* (2013.01)

(58) Field of Classification Search
CPC ............................ G01R 31/3842; B60L 58/22
See application file for complete search history.

(56) References Cited

U.S. PATENT DOCUMENTS 9,851,412 B2 * 12/2017 Haag ....................... B60L 58/22
2012/0286792 A1 11/2012 Gorbold et al.
(Continued)

FOREIGN PATENT DOCUMENTS

EP 2 823 991 A2 1/2015

OTHER PUBLICATIONS

Notification of Transmittal of the International Search Report and the Written Opinion of the International Searching Authority, or the Declaration; PCT/US2022/044203; mail date: Jan. 11, 2023; 14 pages.

*Primary Examiner* — Minh Q Phan
(74) *Attorney, Agent, or Firm* — Carl G. Peterson; Frank D. Cimino

(57) ABSTRACT

A battery management system includes a set of N battery modules coupled together in series, a set of N battery monitors, and a controller. Each battery monitor in the set of N battery monitors is coupled to a respective battery module in the set of N battery modules and measures a battery parameter of the respective battery module. The controller determines a preprogrammed delay for each battery monitor and provides the respective preprogrammed delay to each battery monitory. The controller transmits a synchronization command to the set of N battery monitors, which wait the respective preprogrammed delays in response to receiving the synchronization command before stopping updates to values of the respective battery parameters. The controller transmits a read command to the set of N battery monitors, which transmit read responses to the controller comprising values of the battery parameters.

14 Claims, 6 Drawing Sheets

(51) Int. Cl.

| | |
|---|---|
| ***H02J 7/52*** | (2026.01) |
| ***H02J 7/80*** | (2026.01) |

(56) References Cited

U.S. PATENT DOCUMENTS

| | | | |
|---|---|---|---|
| 2016/0031438 | A1 | 2/2016 | Matsui |
| 2017/0077559 | A1 | 3/2017 | Beaston et al. |
| 2019/0221893 | A1 | 7/2019 | Marsili |
| 2019/0242949 | A1 | 8/2019 | Lemkin et al. |

* cited by examiner 200
210
BATTERY JUNCTION BOX
110
MICROCONTROLLER
160
BRIDGE
ISOLATION
165
180
LOGIC SIDE
185
ISOLATED SIDE
170A
MONITOR
170B
MONITOR
170C
MONITOR
220
230
240
250

400
DEVICES
160
170A
170B
170C
420
Tcommand
READ COMMAND
410
Tmeasure
440
RESPONSE
430A
430B
430C
t0
t1
t2
t3
t4
t5
TIME

750

755 RECEIVE A PREPROGRAMMED DELAY

760 RECEIVE A SYNCHRONIZATION COMMAND AT TIME t0

765 FORWARD THE SYNCHRONIZATION COMMAND

770 WAIT FOR THE PROGRAMMED DELAY FROM TIME t0

775 PERFORM THE SYNCHRONIZATION COMMAND

DEVICE TO DEVICE MEASUREMENT SYNCHRONIZATION

CROSS-REFERENCE TO RELATED APPLICATION

This application is a Division of U.S. patent application Ser. No. 17/489,593, filed Sep. 29, 2021 which is incorporated by reference herein.

BACKGROUND

Modern batteries are used to power hybrid and all-electric vehicles, heavy industrial equipment, and electric aircraft and as energy storage for variable renewable energy grids and the like. Batteries store tens and hundreds of kilowatt hours and are actively monitored and managed to ensure they are operated properly and safely. Some battery management systems include as many as 24 battery cells in a battery module, as many as eight battery modules in a battery pack, and a unique battery monitor for each battery module in the battery pack. The battery monitors measure the respective battery module's temperature, voltage, current, fault conditions, and the like. To accurately capture the state of charge and state of health of the battery pack, the battery monitors should be synchronized to take measurements from the respective battery modules at the same time.

However, daisy-chained battery monitors introduce reclocking delays in forwarding commands to other monitors in the stack and in responding, making it difficult or impossible to synchronize device measurements across the multiple battery monitors.

SUMMARY

A battery management system comprises a set of N battery modules coupled together in series, a set of N battery monitors, and a controller. Each battery monitor in the set of N battery monitors is coupled to a respective battery module in the set of N battery modules and measures a battery parameter of the respective battery module. The controller determines a preprogrammed delay for each battery monitor in the set of N battery monitors and provides each battery monitor the respective preprogrammed delay. The controller transmits a synchronization command, and in response to the synchronization command, the battery monitors wait the respective preprogrammed delays before stopping updates to values of the battery parameters. In some implementations, the preprogrammed delays cause the set of N battery monitors to stop updates to the values of the battery parameters at a same time. The controller transmits a read command to the set of N battery monitors, which transmit read responses comprising the values of the battery parameters to the controller.

In some implementations, the controller and the set of N battery monitors communicate wirelessly, and the controller determines the preprogrammed delay for each battery monitor based on a reclocking delay of the set of N battery monitors and a read order for the set of N battery monitors. The preprogrammed delay for a battery monitor M can be represented as:

$$Tdelay = (Treclocking(N - M)$$

where Tdelay represents the preprogrammed delay, Treclocking represents the reclocking delay, and M represents a position of the battery monitor in the read order.

In some implementations, the set of N battery monitors are coupled together in series to form a stack, and the controller determines the preprogrammed delay for each battery monitor based on a reclocking delay of the set of N battery monitors and a position of each battery monitor in the stack. The preprogrammed delay for a battery monitor M can be represented as:

$$Tdelay = (Treclocking(N - M)$$

where Tdelay represents the preprogrammed delay, Treclocking represents the reclocking delay, and M represents the position of the battery monitor in the stack.

In some implementations, each battery monitor in a subset of the second through N-1 battery monitors forwards the synchronization command and the read command to a subsequent battery monitor in the stack and receives a read response from the subsequent battery monitor, which the battery monitor forwards to a prior battery monitor in the stack. In some implementations, a bridge device is coupled between the controller and the set of N battery monitors.

In some implementations, each battery monitor in the set of N battery monitors comprises a battery parameter measurement circuit for measuring the battery parameter of the respective battery module, an analog-to-digital converter (ADC) coupled to the battery parameter measurement circuit, and a register coupled to the ADC. The ADC samples the battery parameter measurement, and the register stores the value of the battery parameter. Each battery monitor reads the stored value of the battery parameter from the register to generate the read response. In some implementations, the battery monitors stop updates to the values of the battery parameters by stopping updates to the values of the battery parameters from being stored in the registers.

In some implementations, the controller transmits a synchronization disable command to each battery monitor in the set of N battery monitors, which causes each battery monitor to resume updating the stored value of the respective battery parameter.

DETAILED DESCRIPTION

Figure 1:
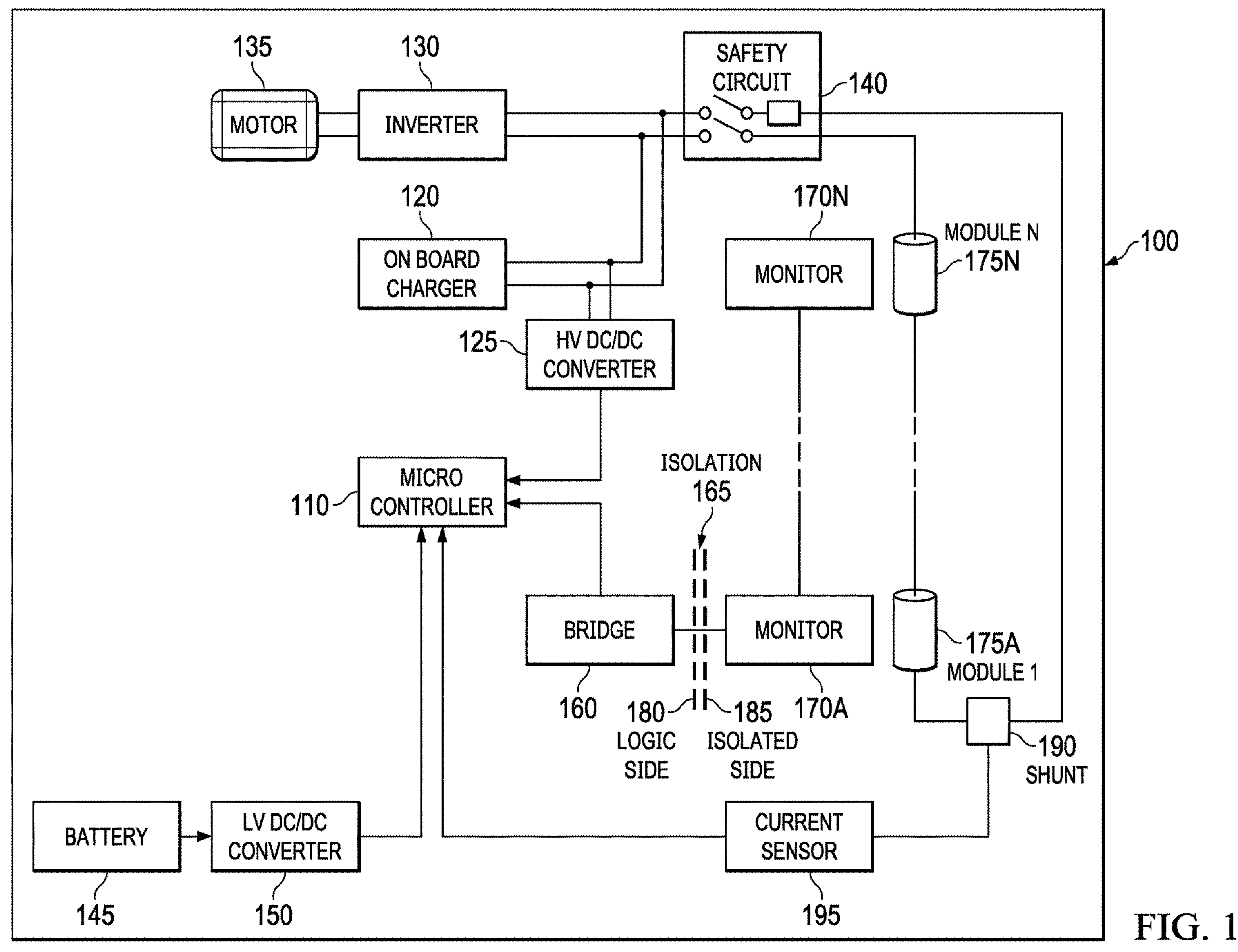
FIG. 1 shows a block diagram of an example battery management system for an electric motor.

The same reference number is used in the drawings for the same or similar (either by function and/or structure) features.

The described battery management systems implement a synchronization command to ensure device-to-device measurement synchronization for battery monitors in the systems. Each battery monitor in the system is assigned a preprogrammed delay based on a reclocking time for the battery monitor and each battery monitor's position in the stack of battery monitors. The battery monitors receive the synchronization command, wait the respective preprogrammed delays, and perform the synchronization command after the respective preprogrammed delays have elapsed. The battery monitors perform the synchronization command by stopping updates to values of a battery parameter of the respective battery modules.

FIG. 1 shows a block diagram of an example battery management system 100 for an electric motor 135. In some examples, the battery management system 100 is implemented in an electric or hybrid electric vehicle. The battery management system 100 includes a microcontroller 110, an on-board charger 120, a high voltage (HV) DC/DC converter 125, an inverter 130, the motor 135, a safety circuit 140, a backup battery cell 145, a low voltage (LV) DC/DC converter 150, a bridge device 160, an isolation barrier 165, daisy-chained battery monitors 170A-N coupled together in series, respective daisy-chained battery modules 175A-N coupled together in series, shunt 190, and current sensor 195.

The onboard charger 120 is used to charge the battery modules 175A-N from an external power source, such as a city's electrical power grid. The HV DC/DC converter 125 steps down the power from the battery modules 175A-N or from the external power source to a lower voltage used to power low voltage electronics, such as the microcontroller 110 or the vehicle's climate control system, window controls, stereo system, and the like. The inverter 130 provides power from the battery modules 175A-N to the motor 135. The safety circuit 140 is coupled between the battery modules 175A-N and the inverter 130, and between the battery modules 175A-N and the on-board charger 120. The safety circuit 140 includes switches or fuses configured to uncouple the battery modules 175A-N from the motor 135 and the on-board charger 120 in the event of a safety failure, such as the battery modules 175A-N becoming overheated and presenting a safety hazard to a driver.

The LV DC/DC converter 150 is coupled to the backup battery cell 145 and steps down the power from the backup battery cell 145 to the lower voltage used to power the microcontroller 110. For example, the backup battery cell 145 is a 12 Volt (V) battery, and the microcontroller 110 operates at 3.3 V. The LV DC/DC converter 150 steps down the 12 V power from the backup battery cell 145 to the 3.3 V used by the microcontroller 110. A bridge device 160 is coupled to the microcontroller 110 and to an isolation barrier 165, which isolates the low voltage electronics such as the bridge device 160 and microcontroller 110 on the logic side 180 from the high voltages experienced by the battery monitors 170A-N and the battery modules 175A-N on the isolation side 185.

The battery monitors 170A-N are coupled together in series to form a stack or daisy chain of battery monitors. Similarly, the battery modules 175A-N are coupled together in series to form a stack or daisy chain of battery modules. Each battery monitor 170A-N corresponds to a battery module 175A-N, and measures battery parameters such as voltage, temperature, undervoltage and/or overvoltage events, fault conditions, and other diagnostics. The battery monitors 170A-N forward the parameters of the respective battery modules 175A-N to the bridge device 160, which links communications between the battery monitors 170A-N and the microcontroller 110. The shunt 190 is coupled between the battery module 175A and the safety circuit 140, and enables the current sensor 195 to measure the current from the battery modules 175A-N.

Figures 2, 4:
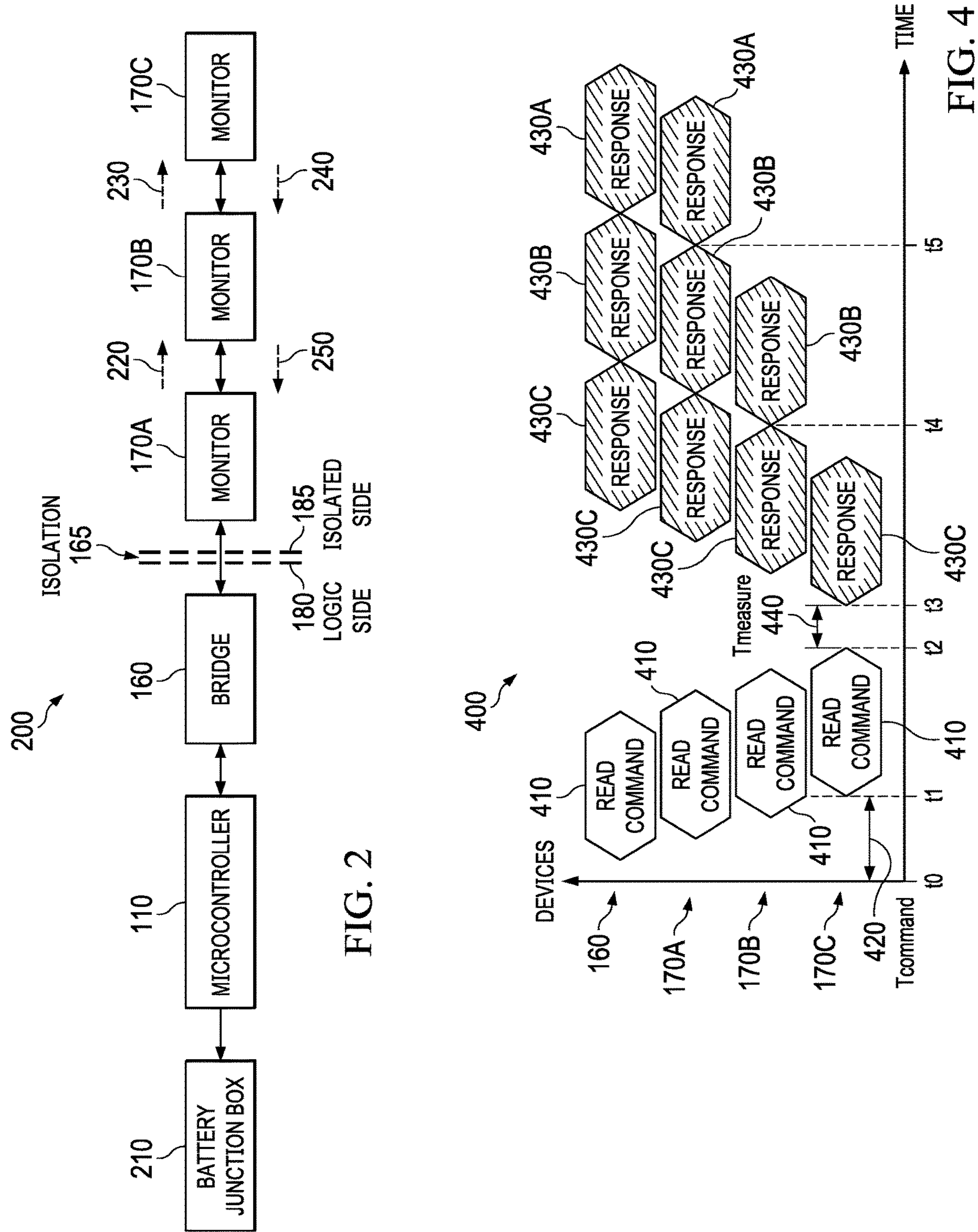
FIG. 2 illustrates a block diagram of an example signal flow for daisy-chained battery monitors in the battery management system shown in FIG. 1.
FIG. 4 illustrates waveforms of commands and responses forwarded by daisy-chained battery monitors in the battery management system shown in FIG. 1.

FIG. 2 illustrates a block diagram 200 of an example signal flow for daisy-chained battery monitors 170A-C in the battery management system 100 shown in FIG. 1. For ease of explanation, the diagram 200 is described herein with reference to the battery management system 100 shown in FIG. 1. In this example, the battery management system 100 includes three battery monitors 170A-C, and the microcontroller 110 provides information about the battery modules to the battery junction box 210. The battery junction box 210 can be a switching circuit configured to coupled or uncoupled electrical circuits from the battery modules 175A-C (not shown) based on the information about the battery modules from the microcontroller 110. Returning to the electric vehicle example, the battery junction box 210 can uncouple all electrical systems from the battery modules 175A-C in the event of a car crash, so that rescue workers are not exposed to uncontrolled high voltages.

The microcontroller 110 transmits a read command to the bridge device 160. A read command is a command to read a battery parameter from the monitors 170A-C, such as a battery module voltage, temperature, and the like. The bridge device 160 forwards the read command across the isolation barrier 165 to the monitor 170A. Monitor 170A forwards the read command to monitor 170B and waits to perform the read command until the upstream monitors 170B and 170C respond. Monitor 170A introduces a command reclocking delay 220 between itself and monitor 170B. Monitor 170B forwards the read command to monitor 170C and waits to perform the read command until the upstream monitor 170C responds. Similar to monitor 170A and command reclocking delay 220, monitor 170B introduces a command reclocking delay 230 between itself and monitor 170C. The command reclocking delays 220 and 230 can be the same or different lengths of time.

Monitor 170C receives and performs the read command, and forwards its response to monitor 170B. Monitor 170C introduces a response reclocking delay 240 between itself and monitor 170B, which can be the same or a different length of time as the command reclocking delays 220 and 230. Monitor 170B receives and forwards the response from monitor 170C to monitor 170A, performs the read command itself, and forwards its response to monitor 170A. Monitor 170B introduces a response reclocking delay 250 between itself and monitor 170A, which can be the same or a different length of time as the command reclocking delays 220 and 230, and response reclocking delay 240.

Monitor 170A receives and forwards the responses from monitor 170C and monitor 170B to the bridge device 160, and performs the read command itself. Monitor 170A forwards its response to bridge device 160. As illustrated further in the waveforms shown in FIG. 4, the command reclocking delays 220 and 230 and the response reclocking delays 240 and 250 cause the monitors 170A-C to perform the read command at different times, such that battery parameters for the respective battery modules 175A-C are measured at different times. That is, the device measurements are not synchronized.

Figure 3:
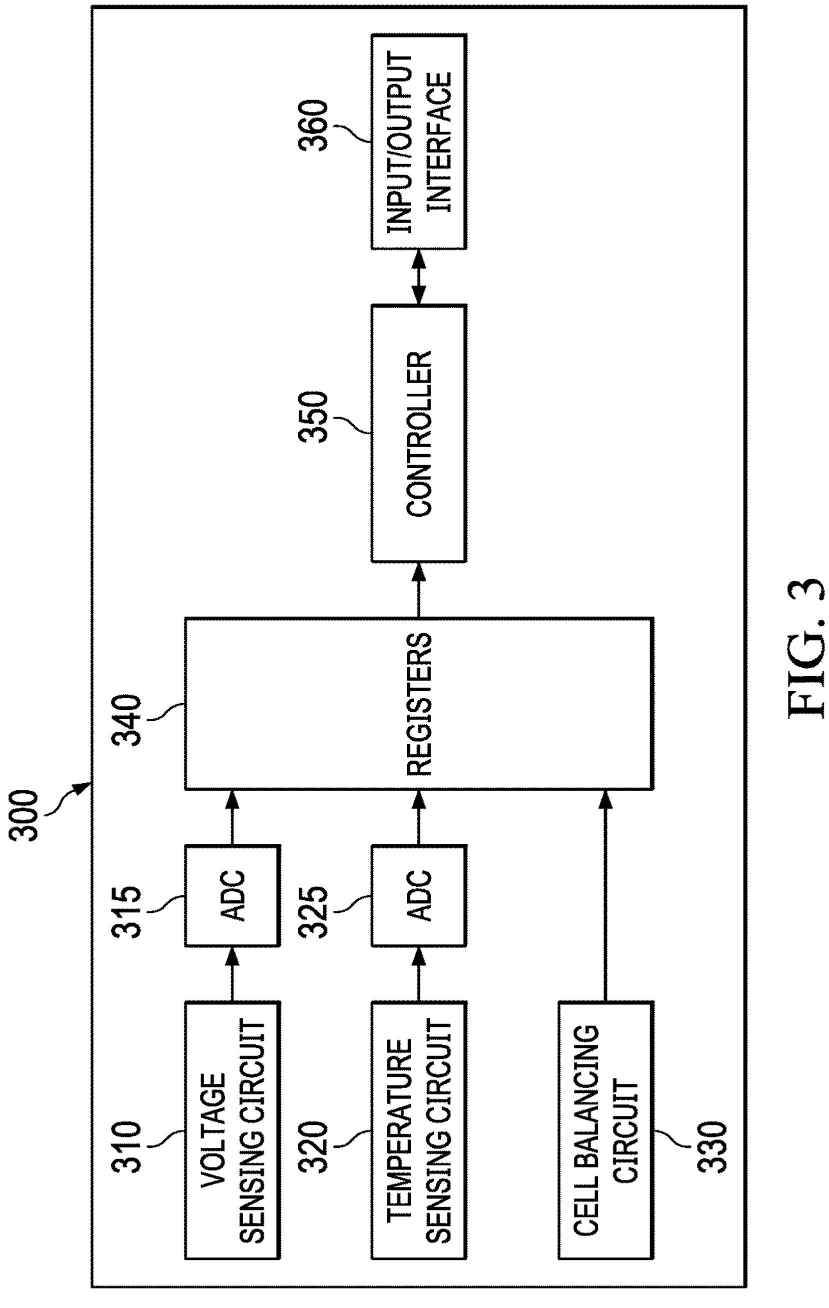
FIG. 3 illustrates a block diagram of an example battery monitor.

FIG. 3 illustrates an example monitor 300 that can be used for any of the monitors 170A-N shown in FIG. 1. The monitor 300 includes a voltage sensing circuit 310, a temperature sensing circuit 320, a cell balancing circuit 330, analog-to-digital converters (ADCs) 315 and 325, registers 340, a controller 350, and an input/output (I/O) interface 360. The voltage sensing circuit 310 measures a voltage across the respective battery module, and ADC 315 samples the analog voltage signal to obtain a digital voltage signal. The temperature sensing circuit 320 measures a temperature of the respective battery module, and ADC 325 samples the analog temperature signal to obtain a digital temperature signal and stores the samples in registers 340.

In a continuous conversion mode of operation, the ADCs 315 and 325 continuously sample the voltage signal and the temperature signal, respectively, and store the latest samples in registers 340. In the continuous conversion mode of operation, analog and/or digital filtering can be performed to reduce the influence of noise in the voltage and temperature signals. In a single conversion mode of operation, the ADCs 315 and 325 sample the voltage signal and the temperature signal, respectively, upon command and stores the single samples in registers 340. Filtering is not performed in single conversion mode of operation.

The cell balancing circuit 330 performs cell balancing operations to maintain a constant state of charge for the respective battery module. The cell balancing circuit 330 stores information about the cell balancing operations in registers 340, such as undervoltage or overvoltage conditions, fault conditions, and the like. The I/O interface 360 receives commands and outputs responses. For example, the I/O interface 360 receives a read command, controller 350 reads the current values of the respective battery module's voltage, temperature, and any fault conditions from registers 340, and I/O interface 360 outputs a response with the current values.

FIG. 4 illustrates waveforms 400 of commands and responses forwarded by daisy-chained battery monitors 170A-C in the battery management system 100 shown in FIG. 1. For ease of illustration, the waveforms 400 are described herein with reference to the battery management system 100 shown in FIG. 1, the signal flow diagram 200 shown in FIG. 2, and the example monitor 300 shown in FIG. 3. At a time t0, the bridge circuit 160 receives a read command 410 from microcontroller 110. The read command 410 is forwarded to monitor 170A, monitor 170B, and finally to monitor 170C, which receives the read command 410 at a time t1. The period Tcommand 420 from time t0 to time t1 includes a command reclocking delay for the bridge circuit 160 and the command reclocking delays 220 and 230 for monitors 170A and 170B, respectively. The command reclocking delay for the bridge circuit 160 can be the same or different from the command reclocking delays 220 and 230 for monitors 170A and 170B.

At time t2, the monitor 170C performs the read command and measures the desired battery parameters of the respective battery module 175C. That is, the monitor 170C reads the values of the desired battery parameters from the registers 340 at time t2. At time t3, the monitor 170C forwards the response 430C including the battery parameters of battery module 175C to monitor 170B. The period Tmeasure 440 between time t2 and t3 is a length of time for monitor 170C to read the battery parameters. Monitor 170B receives and forwards the response 430C from monitor 170C to monitor 170A. Monitor 170B performs the read command at a time t4 and measures the desired battery parameters of the respective battery module 175B. That is, the monitor 170B reads the values of the desired battery parameters from the registers 340 at time t4. Monitor 170B forwards the response 430B including the battery parameters of battery module 175B to monitor 170A.

Monitor 170A receives and forwards the response 430C and the response 430B from monitor 170B to bridge device 160. Monitor 170A performs the read command at a time t5 and measures the desired battery parameters of the respective battery module 175A. That is, monitor 170A reads the values of the desired battery parameters from the registers 340 at time t5. Monitor 170A forwards the response 430A including the battery parameters of battery module 175A to bridge device 160. As illustrated by the waveforms 400, the monitors 170A-C read the stored values of the battery parameters of the respective battery modules 175A-C, respectively, at times t5, t4, and t3, respectively.

Figure 5A:
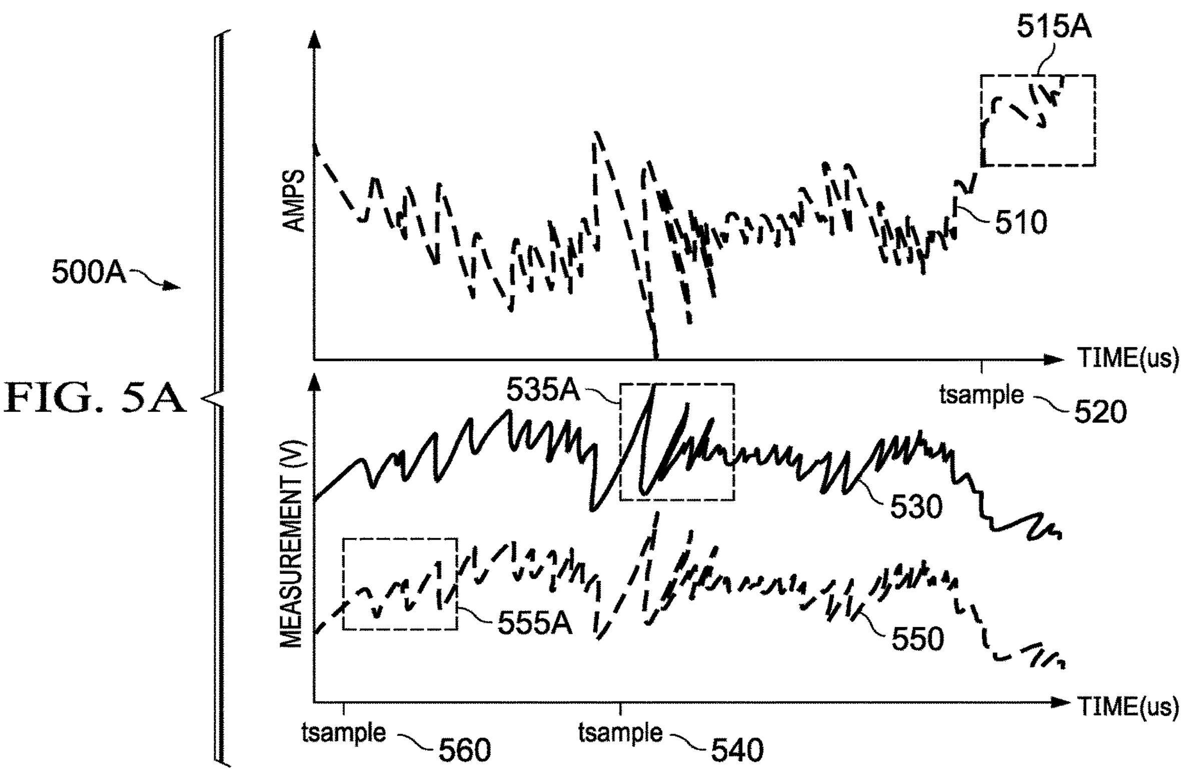
FIGS. 5A-B illustrate waveforms of a current through the daisy-chained batteries and a voltage across two of the daisy-chained batteries in the battery management system shown in FIG. 1.
Figure 5B:
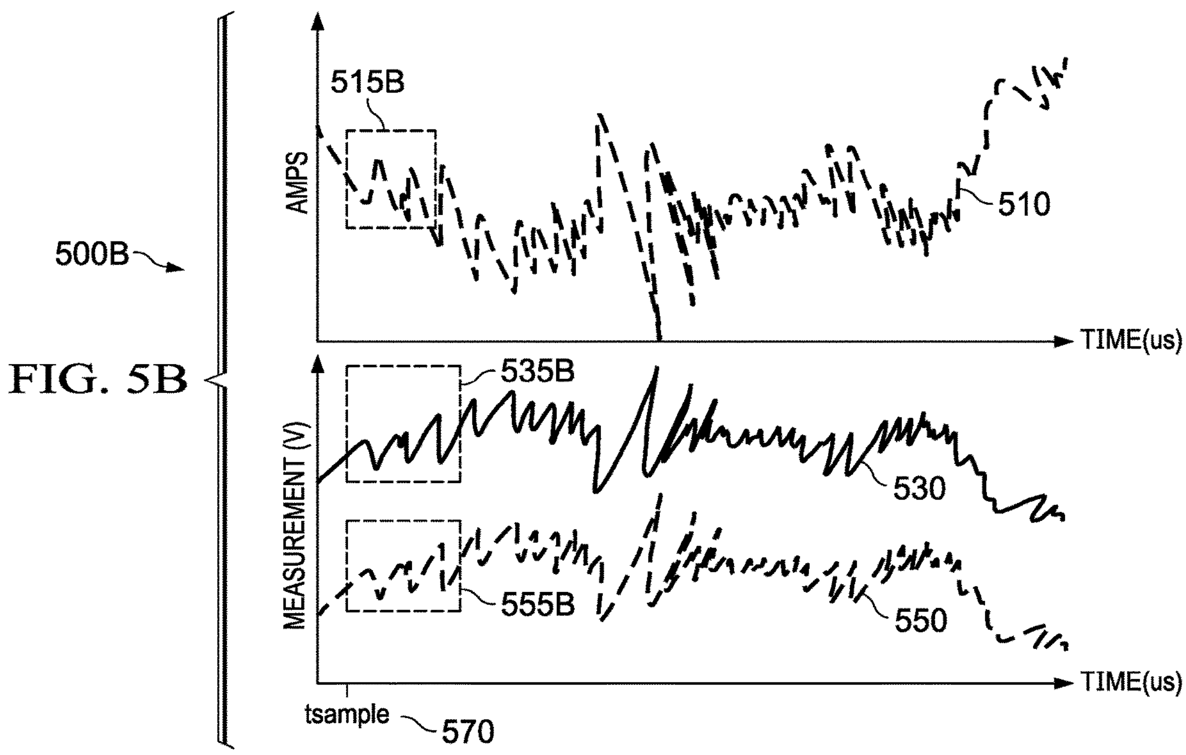

FIGS. 5A-B illustrate waveforms of a current 510 through the daisy-chained batteries 175A-N and voltages 530 and 550 across two of the daisy-chained batteries 175A-N in the battery management system 100 shown in FIG. 1. For ease of explanation, FIGS. 5A-B are described herein with reference to battery management system 100 shown in FIG. 1. The current 510 can be measured by the current sensor 195. Interference in the current measurement 510 and the voltage measurements 530 and 550 can appear as spikes, steps, sine waves, or other random noise, and can be caused by the motor 135, unshielded communication and/or power buses, radio frequency transceivers and other electronic systems in the vehicle, and the like.

FIG. 5A illustrates waveforms 500A of the current 510 and voltages 530 and 550 measured without device measurement synchronization. The sample 515A of current 510 is taken at a time tsample 520. The sample 535A of the voltage 530 is taken at a time tsample 540, and the sample 555A of the voltage 550 is taken at a time tsample 560. None of the sampling times 520, 540, and 560 are the same, and the noise conditions at each of the sampling times 520, 540, and 560 are different. The differing noise conditions can introduce errors into battery management calculations, such as the remaining range of the electric vehicle on its current batteries. An error in the calculation of the remaining range of the electric vehicle can leave a driver stranded without an opportunity to recharge the battery modules 175A-N, for example.

FIG. 5B illustrates waveforms 500B of the current 510 and voltages 530 and 550 measured with device measurement synchronization. The current sensor 195 and the battery monitors 170 respective to the batteries for voltages 530 and 550 are synchronized, such that each performs the appropriate measurements at the same time. That is, the sample 515B of current 510, the sample 535B of the voltage 530, the sample 555B of the voltage 550 are taken at a same time tsample 570 under the same noise conditions.

Figure 6:
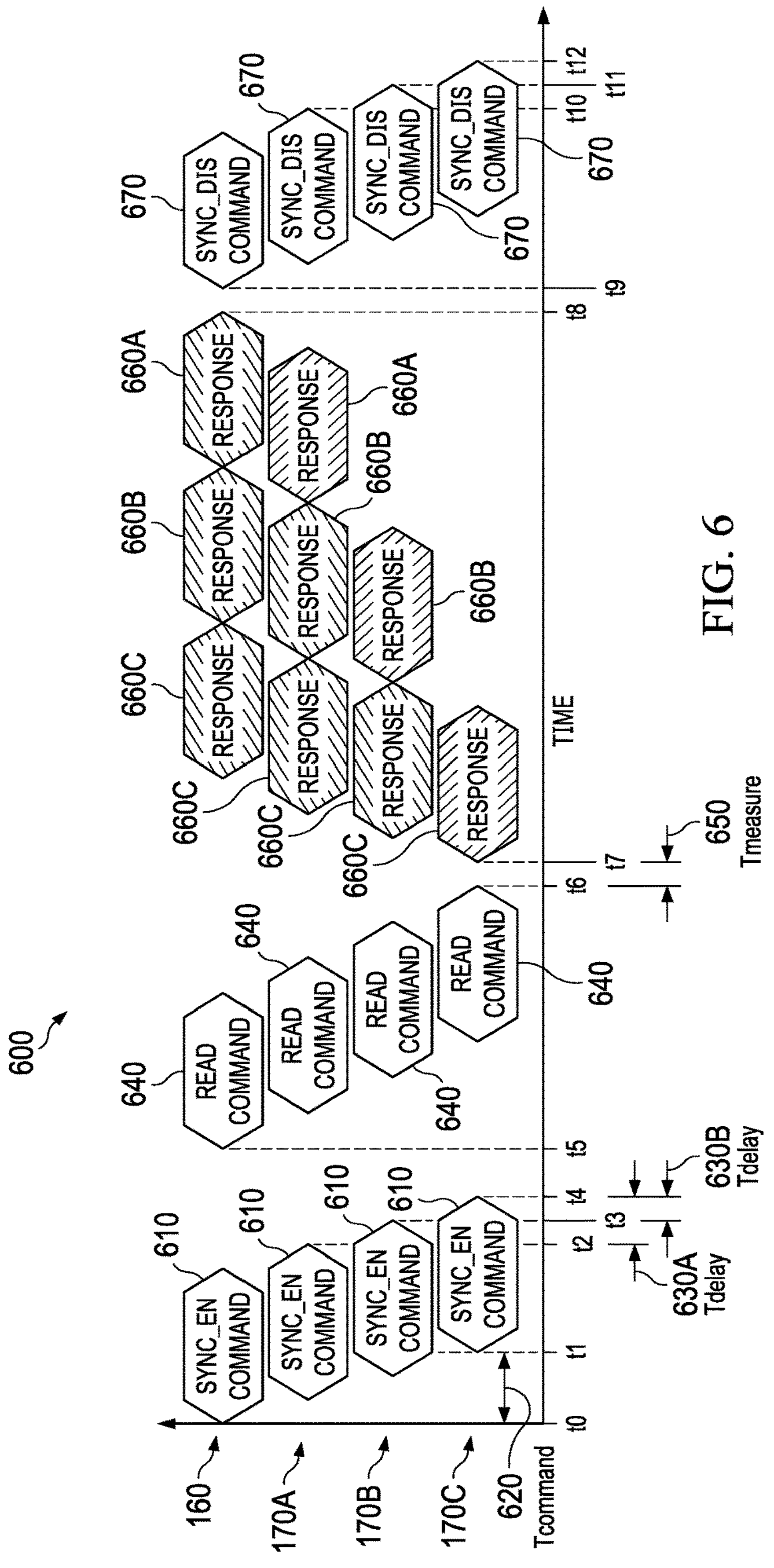
FIG. 6 illustrates waveforms of commands and synchronized responses forwarded by daisy-chained battery monitors in the battery management system shown in FIG. 1.

FIG. 6 illustrates waveforms 600 of commands and synchronized responses forwarded by daisy-chained battery monitors 170A-C in the battery management system 100 shown in FIG. 1 and the example monitor 300 shown in FIG. 3. At a time t0, the bridge circuit 160 receives a synchronization SYNC_EN command 610 from microcontroller 110. The SYNC_EN command 610 is forwarded to monitors 170A, monitor 170B, and finally to monitor 170C at a time t1. The period Tcommand 620 from time t0 to time t1 includes a command reclocking delays for the bridge circuit 160 and monitors 170A and 170B.

At time t2, monitor 170A finishes forwarding the SYNC_EN command 610 to monitor 170B and begins a delay period Tdelay 630A. At time t3, monitor 170B finishes forwarding the SYNC_EN command 610 to monitor 170C and begins a delay period Tdelay 630B. At time t4, monitor 170C finishes receiving the SYNC_EN command 610, and monitors 170A, 170B, and 170C simultaneously stop refreshing the values of the battery parameters stored in the registers 340. The lengths of delay period Tdelay 630A between time t2 and time t4 and the delay period Tdelay 630B between time t3 and time t4 are chosen to compensate for the command reclocking delays and cause monitors 170A, 170B, and 170C to stop refreshing the values stored in the registers 340 at the same time t4. In some implementations, monitors 170A, 170B, and 170C continue to measure and update the values of the battery parameters stored in an internally readable register, and stop updating the values of the battery parameters stored in an externally readable register, such as registers 340.

At time t5 after time t4, bridge device 160 receives a read command 640, which is forwarded to monitor 170A, 170B, and 170C. At time t6, monitor 170C finishes receiving the read command 650 and performs the read operation. That is, monitor 170C reads the values corresponding to time t4 for the desired battery parameters of the respective battery module 175C from the registers 340. At time t7, monitor 170C transmits a response 660C including the battery parameters of battery module 175C to monitor 170B. The period Tmeasure 650 between time t6 and t7 is a length of time for monitor 170C to read the battery parameters. Monitor 170B receives and forwards the response 660C from monitor 170C to monitor 170A. Monitor 170B reads the values corresponding to time t4 for the desired battery parameters of the respective battery module 175B from the registers 340 and transmits the response 660B including the battery parameters of battery module 175B to monitor 170A.

Monitor 170A receives and forwards the response 660C and the response 660B from monitor 170B to bridge device 160. Monitor 170A reads the values corresponding to time t4 for the desired battery parameters of the respective battery module 175A from the registers 340 and transmits the response 660A including the battery parameters of battery module 175A to bridge device 160. Bridge device 160 forwards the responses 660C, 660B, and 660A to microcontroller 110, and finishes transmitting the response 660A at time t8. At time t9 after time t8, bridge device 160 receives a synchronization disable SYNC_DIS command 670 from microcontroller 110. The SYNC_DIS command 670 is forwarded to monitor 170A, 170B and 170C.

At time t10, monitor 170A finishes forwarding the SYNC_DIS command 670 to monitor 170B and disables its synchronization. That is, monitor 170A begins refreshing the values of the battery parameters of the respective battery module 175A stored in the registers 340. At time t11, monitor 170B finishes forwarding the SYNC_DIS command 670 to monitor 170C and disables its synchronization. That is, monitor 170B begins refreshing the values of the battery parameters of the respective battery module 175B stored in the registers 340. At time t12, monitor 170C finishes receiving the SYNC_DIS command 670 and disables its synchronization. That is, monitor 170C begins refreshing the values of the battery parameters of the respective battery module 175C stored in the registers 340.

Figures 7A, 7B:
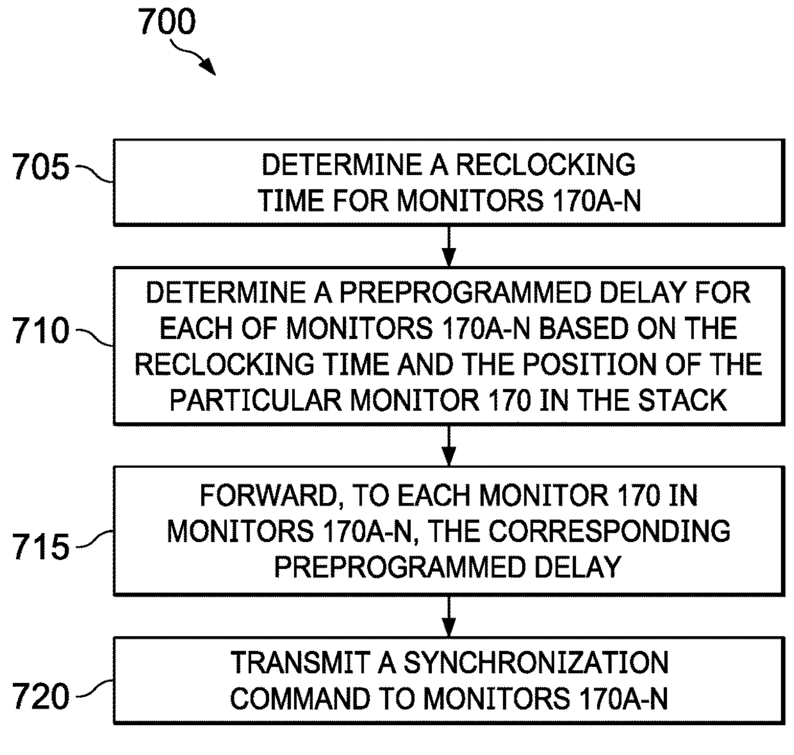
FIG. 7A shows a flowchart of an example process for device measurement synchronization by a microcontroller in the battery management system shown in FIG. 1.
FIG. 7B shows a flowchart of an example process for device measurement synchronization by a daisy-chained battery monitory in the battery management system shown in FIG. 1.

FIG. 7A shows a flowchart of an example process 700 for device measurement synchronization by a microcontroller 110 in the battery management system 100 shown in FIG. 1. For ease of illustration, the process 700 is described herein with reference to the battery management system 100 shown in FIG. 1. At step 705, the microcontroller 110 determines a reclocking time for each of the monitors 170A-N. The reclocking time can be the same or different for each monitor 170. The reclocking times may be determined based on device specifications for the monitors 170A-N, the clocking frequencies of the monitors 170A-N, and the like.

At step 710, the microcontroller 110 determines a preprogrammed delay Tdelay for each of the monitors 170A-N based on the determined reclocking time and the position of the particular monitor 170 in the stack. For example, three monitors 170A, 170B, and 170C have a same reclocking time of five microseconds (μs). The monitor 170A is assigned a preprogrammed delay of ten μs, and the monitor 170B is assigned a preprogrammed delay of five μs. For monitors with a same reclocking time, the preprogrammed delay for a particular monitor can be represented as:

$$Tdelay(M) = (Treclock(N - M)$$

where Treclock represents the determined reclocking time, N represents the number of monitors in the daisy chain, and M represents the position of the particular monitor in the daisy chain.

At step 715, the microcontroller forwards the preprogrammed delays to the monitors 170A-N, for example via bridge device 160. In some implementations, the battery management system 100 is a wireless battery management system, and microcontroller 110 and monitors 170A-N communicate wirelessly and directly, without an intervening bridge device 160. The microcontroller 110 transmits the preprogrammed delay directly to the respective monitor 170 in these embodiments. At step 720, the microcontroller transmits a synchronization SYNC_EN command to monitors 170A-N to synchronize measurement of device parameters.

FIG. 7B shows a flowchart of an example process 750 for device measurement synchronization by a daisy-chained battery monitory 170 in the battery management system 100 shown in FIG. 1. For ease of illustration, the process 750 is described herein with reference to the battery management system 100 shown in FIG. 1. At step 755, the monitor 170 receives a preprogrammed delay Tdelay. At step 760 and a time t0, the monitor 170 receives the synchronization SYNC_EN command. At optional step 765, the monitor 170 forwards the synchronization SYNC_EN command to the next monitor in the daisy chain. In a wireless battery management system, each monitor 170 receives the synchronization SYNC_EN command directly from microcontroller 110, rather than forwarded by the preceding monitor in the daisy chain.

At step 770, the monitor 170 waits the preprogrammed delay Tdelay from time to. After the preprogrammed delay Tdelay has passed and at step 775, the monitor 170 performs the synchronization SYNC_EN command and stops refreshing the values of battery parameters in registers in the monitor 170. In a wireless battery management system, there is no reclocking delay as the commands and responses are transmitted through the daisy chain of monitors 170A-N. Instead, the monitors 170A-N directly receive commands and transmit responses to microcontroller 110. However, microcontroller 110 reads the responses in series, not in parallel. The synchronization SYNC_EN command ensures that the responses and values of the battery parameters from the monitors 170A-N correspond to a same time despite being read by the microcontroller 110 in series.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

Unless otherwise stated, "about," "approximately," or "substantially" preceding a value means+/−10 percent of the stated value. Modifications are possible in the described examples, and other examples are possible within the scope of the claims.

Modifications are possible in the described embodiments, and other embodiments are possible, within the scope of the claims.

What is claimed is:

1. A method, comprising:

receiving, by a first battery monitor in a set of N battery monitors, a synchronization command;

forwarding, by the first through N-1 battery monitors, the synchronization command to a subsequent battery monitor;

waiting, by the first through N-1 battery monitors, a respective programmed delay time, wherein the respective programmed delay time for the first battery monitor is longer than the respective programmed delay time for the N-1 battery monitors;

stopping, by the set of N battery monitors, updates to stored values in the set of N battery monitors;

receiving, by the first battery monitor, a read command;

forwarding, by the first through the N-1 battery monitors, the read command to a subsequent battery monitor;

reading, by the set of N battery monitors, the stored values; and forwarding, by the N-1 through the first battery monitors, stored values from subsequent battery monitors and the respective stored value.

2. The method of claim 1, further comprising:

receiving, by the first battery monitor, a synchronization disable command;

forwarding, by each of the first through N-1 battery monitors, the synchronization disable command to the respective subsequent battery monitor; and updating, by the set of N battery monitors, the stored values.

3. The method of claim 1, wherein the programmed delays are based on a reclocking delay of the set of N battery monitors.

4. The method of claim 3, wherein for a particular battery monitor M in the first through the N-1 battery monitors, the respective programmed delay is represented as:

$$Tdelay = (Treclocking(N - M)$$

where Tdelay represents the respective programmed delay, Treclocking represents the reclocking delay, and M represents a position of the particular battery monitor in the first through the N-1 battery monitors.

5. The method of claim 1, wherein the stored value for a particular battery monitor comprises a value of a battery parameter for a battery module associated with the particular battery monitor.

6. The method of claim 1, wherein waiting, by the first through N-1 battery monitors, a respective programmed delay time causes the set of N battery monitors to stop updates to the stored values at a same time.

7. A device configurable to:

determine, for each battery monitor in a set of N battery monitors, a respective delay time based on a reclocking time for each respective battery monitor in the set of N battery monitors, provide the respective delay time to each respective battery monitor in the set of N battery monitors;

transmit a synchronization command to each respective battery monitor in the set of N battery monitors, wherein each respective battery monitor is configurable to wait the respective delay time prior to performing the synchronization command;

transmit a read command to each respective battery monitor in the set of N battery monitors; and receive a respective read response from each respective battery monitor in the set of N battery monitors.

8. The device of claim 7, wherein the set of N battery monitors are configurable to receive the respective read responses based on a particular read order.

9. The device of claim 8, wherein each respective delay time is based on the particular read order.

10. The device of claim 9, wherein the delay time is represented as:

$$Tdelay = (Treclocking(N - M)$$

where Tdelay represents the delay time, Treclocking represents the reclocking time, and M represents a position of a particular battery monitor in the first through the N-1 battery monitors.

11. The device of claim 7, wherein performing the synchronization command includes stopping updating a value of a respective battery parameter.

12. The device of claim 11, wherein the device is configurable to transmit a synchronization disable command to each respective battery monitor in the set of N battery monitors, and the synchronization disable command causes each respective battery monitor in the set of N battery monitors to resume updating the value of the respective battery parameter.

13. The device of claim 7, wherein each respective battery monitor in the set of N battery monitors includes:

a battery parameter measurement circuit configurable to measure a battery parameter of each respective battery module;

an analog-to-digital converter (ADC) coupled to the battery parameter measurement circuit and configurable to sample the battery parameter; and a register coupled to the ADC and configurable to store a value of the battery parameter.

14. The device of claim 13, wherein the battery parameter measurement circuit is configurable to measure at least one of: voltage, temperature, overvoltage events, undervoltage events, and fault conditions.

* * * * *